(12) United States Patent  (10) Patent No.: US 7,538,001 B2
Ramaswamy et al.  (45) Date of Patent: May 26, 2009

(54) TRANSISTOR GATE FORMING METHODS AND INTEGRATED CIRCUITS

(75) Inventors: D. V. Nirmal Ramaswamy, Boise, ID (US); Ravi Iyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 471 days.

(21) Appl. No.: 11/219,079

(22) Filed: Sep. 1, 2005

(65) Prior Publication Data

US 2007/0048946 A1    Mar. 1, 2007

(51) Int. Cl.
    *H01L 21/00* (2006.01)
(52) U.S. Cl. .................. 438/287; 438/301; 438/585; 438/592; 438/688; 438/722; 257/E21.191; 257/E21.197; 257/E21.215; 257/E21.241; 257/E21.281
(58) Field of Classification Search ............ 438/199, 438/287, 301, 585, 590, 591, 592, 633, 637, 438/639, 645, 648, 688, 722, 723, 767, 769, 438/786, 792, 795; 257/E21.029, 191, 197, 257/201, 215, 241, 274, 281, 297, 304, 444.507, 257/621, 654
    See application file for complete search history.

(56) References Cited

U.S. PATENT DOCUMENTS

| | | | | |
|---|---|---|---|---|
| 6,436,775 B2 * | 8/2002 | Kim et al. | ............ | 438/301 |
| 6,613,695 B2 * | 9/2003 | Pomarede et al. | ............ | 438/767 |
| 6,624,065 B2 * | 9/2003 | Jang et al. | ............ | 438/633 |
| 6,858,524 B2 * | 2/2005 | Haukka et al. | ............ | 438/585 |
| 6,958,277 B2 * | 10/2005 | Pomarede et al. | ............ | 438/287 |
| 2003/0119292 A1 * | 6/2003 | Lee et al. | ............ | 438/596 |
| 2004/0180487 A1 | 9/2004 | Eppich et al. | ............ | 438/199 |
| 2006/0084217 A1 * | 4/2006 | Luo et al. | ............ | 438/199 |

* cited by examiner

*Primary Examiner*—Michael S Lebentritt
(74) *Attorney, Agent, or Firm*—Wells St. John P.S.

(57) ABSTRACT

A transistor gate forming method includes forming a first and a second transistor gate. Each of the two gates includes a lower metal layer and an upper metal layer. The lower metal layer of the first gate originates from an as-deposited material exhibiting a work function the same as exhibited in an as-deposited material from which the lower metal layer of the second gate originates. However, the first gate's lower metal layer exhibits a modified work function different from a work function exhibited by the second gate's lower metal layer. The first gate's lower metal layer may contain less oxygen and/or carbon in comparison to the second gate's lower metal layer. The first gate's lower metal layer may contain more nitrogen in comparison to the second gate's lower metal layer. The first gate may be a n-channel gate and the second gate may be a p-channel gate.

33 Claims, 7 Drawing Sheets

TRANSISTOR GATE FORMING METHODS AND INTEGRATED CIRCUITS

TECHNICAL FIELD

The invention pertains to transistor gate forming methods and integrated circuits including transistor gates.

BACKGROUND OF THE INVENTION

Conventional MOS technology employs transistor gates including a metal layer over a doped polysilicon layer that is, in turn, over a gate dielectric. Conventional CMOS uses complementary n-channel and p-channel MOS transistors. Since CMOS includes both n-channel and p-channel gates, the gates typically exhibit different work functions depending upon whether the channel exhibits n-type or p-type conductivity. For example, p-channel transistor gates typically exhibit a work function of from 4.5 to 5.2 electron volts (eV) and n-channel transistor gates typically exhibit a work function of from 3.8 to 4.5 eV. Work function in polysilicon components of transistor gates may be controlled and/or optimized by the quantity and type of conductivity dopant. Accordingly, transistor gates containing polysilicon may be optimized to a work function corresponding to the respective n-channel and p-channel regions in CMOS.

Unfortunately, polysilicon, even when doped, generally exhibits a lower conductivity in comparison to the conductivity exhibited by many metal layers. Accordingly, obtaining desirable performance in CMOS devices often includes providing a strapping layer exhibiting a higher conductivity than the doped polysilicon. Exemplary compositions for strapping layers include elemental metal or metal silicide.

It would be an improvement to identify suitable materials and processing methods that use materials with a higher conductivity than conventional doped polysilicon, but are still optimizable to the work function characteristics desired for CMOS. Herein lays the difficulty, since known metal gates of such higher conductivity exhibit inherent work function characteristics that are not conventionally known to be optimizable. N-channel metal gates and p-channel metal gates may be deposited separately using different materials to obtain the different work functions. Even though multiple depositions of materials exhibiting different work functions might be used, such an approach adds significantly to the complexity of processes for producing CMOS devices. A simpler approach would be more advantageous.

SUMMARY OF THE INVENTION

In one aspect of the invention, a transistor gate forming method includes forming a first and a second transistor gate. Each of the two gates includes a lower metal layer and an upper metal layer. The lower metal layer of the first gate originates from an as-deposited material exhibiting a work function the same as exhibited in an as-deposited material from which the lower metal layer of the second gate originates. However, the lower metal layer of the first gate exhibits a work function that is modified from its as-deposited state to differ from a work function exhibited by the lower metal layer of the second gate.

In another aspect of the invention, a transistor gate forming method includes forming a lower metal layer exhibiting a work function and modifying the work function of a first portion of the lower metal layer without modifying the work function of a second portion of the lower metal layer. An upper metal layer is formed over the first and second portions of the lower metal layer. A first transistor gate is formed including material from the upper metal layer and material from the first portion of the lower metal layer. A second transistor gate is formed including material from the upper metal layer and material from the second portion of the lower metal layer.

In a further aspect of the invention, an integrated circuit includes a transistor gate in operative association with a n-channel and a transistor gate in operative association with a p-channel. Each of the two gates includes a lower metal layer and an upper metal layer. The lower metal layer of the n-channel gate consists essentially of the same elements as the lower metal layer of the p-channel gate, but in different proportions such that the two gates exhibit different work functions that correspond to the conductivity type of their respective channels. By way of example, the lower metal layer of the n-channel gate may consist of the same elements as the lower metal layer of the p-channel gate. The lower metal layer of the n-channel gate may contain less oxygen and/or carbon in comparison to the lower metal layer of the p-channel gate. The lower metal layer of the n-channel gate may contain more nitrogen in comparison to the lower metal layer of the p-channel gate.

BRIEF DESCRIPTION OF THE DRAWINGS

Preferred embodiments of the invention are described below with reference to the following accompanying drawings.

FIG. 6 shows a chart comparing work function of various transistor gate structures.

FIG. 7 shows a chart comparing work function for various transistor gate structures after annealing and BPSG reflow.

DETAILED DESCRIPTION OF THE PREFERRED EMBODIMENTS

According to one aspect of the invention, a transistor gate forming method includes forming a first and a second transistor gate. Each of the two gates includes a lower metal layer and an upper metal layer. The lower metal layer of the first gate originates from an as-deposited material exhibiting a work function the same as exhibited in an as-deposited material from which the lower metal layer of the second gate originates. However, the lower metal layer of the first gate exhibits a work function that is modified from its as-deposited state to differ from a work function exhibited by the lower metal layer of the second gate.

In the context of the present document, "metal" layer refers to a conductive layer containing a metal compound or compounds (which compound may further include semimetals and/or nonmetals), an elemental metal, or a metal alloy. Elements considered to be metals in this document do not include semimetals. Accordingly, semimetals B, Si, As, Se, Te, and At are not considered to be metals. In the context of the present document, "work function" ($\phi_m$) refers to the energy needed to pull an electron at its Fermi level into vacuum. "Fermi" level is the energy level at which a 50% probability exists of finding electrons at that energy level.

By way of example, the upper metal layers may be formed on and in physical contact with the lower metal layers. The lower metal layers may include a first metal and the upper metal layers may include a second metal different from the first metal. The lower metal layers may include the same one or more material selected from the group consisting of titanium, tantalum, tungsten, titanium nitride, tantalum nitride, tungsten nitride, aluminum nitride, titanium silicide, tantalum silicide, tungsten silicide, and tantalum silicon nitride. The upper metal layers may include the same one or more material selected from the group consisting of tungsten, titanium nitride, titanium silicide, tantalum silicide, tungsten silicide, and tantalum silicon nitride. Particular advantage may be achieved when the lower metal layers include tantalum nitride and the upper metal layers include titanium nitride.

Also, advantages in simplifying processing may be achieved when the material from which the lower metal layer of the first gate originates is deposited simultaneously with the material from which the lower metal layer of the second gate originates. For example, a tantalum nitride layer may be deposited and part of the deposited layer may be used to form the lower metal layer of the first transistor gate while another part is used to form the lower metal layer of the second transistor gate. Further, processing advantages may also be realized when the upper metal layers originate from a simultaneously deposited material that is different from the material from which the lower metal layers originate. One example includes depositing a titanium nitride layer over a tantalum nitride layer and processing to form upper and lower metal layers for the first and second transistor gates.

Even though aspects of the invention described herein are not limited to any particular technology, significant advantage may be achieved in CMOS technology. Accordingly, the second gate may exhibit properties suitable for use with a p-channel, that is, a channel exhibiting p-type conductivity. The first gate may exhibit properties suitable for use with a n-channel, that is, a channel exhibiting n-type conductivity. For example, the second gate may exhibit a work function of about 4.9 eV by including a titanium nitride layer with a work function of about 4.9 eV and a tantalum nitride layer exhibiting its as-deposited work function of about 4.7 eV. The first gate may exhibit a work function of about 4.1 eV by including a titanium nitride layer with a work function of about 4.9 eV and a tantalum nitride layer exhibiting a work function that is modified from its as-deposited state.

Modifying work function of the as-deposited material from which the lower metal layer of the first gate originates may include altering composition of the as-deposited material. It is conceivable that some processing method may exist capable of modifying only the work function of the as-deposited material from which the lower metal layer of the first gate originates without altering its composition. However, the most likely suitable processing methods may alter composition in addition to modifying work function. Depending upon deposition technique, forming the as-deposited material from which the lower metal layer of the first gate originates may yield a material containing impurities, for example, oxygen, carbon, nitrogen, etc.

Conventional chemical vapor deposition (CVD), including atomic layer deposition (ALD), of metal layers using organometallic precursors potentially yields oxygen and/or carbon impurities in the as-deposited layer. Nitrogen may also be present, but is not considered an impurity if the metal layer is a metal nitride layer. It follows that altering composition of the as-deposited material may thus include reducing oxygen and/or carbon content. Altering composition may instead or in addition include increasing nitrogen content. In the case of a metal nitride as the metal layer, increasing nitrogen content may be particularly effective in modifying the work function.

As indicated, the lower metal layer of the first gate exhibits a work function that is modified from its as-deposited state to differ from a work function exhibited by the lower metal layer of the second gate. Accordingly, modifying the work function of the as-deposited material for the first gate preferably does not have the effect of also modifying the work function of the as-deposited material for the second gate. However, it is conceivable that some modification of the work function of the as-deposited material for the second gate may occur some time during the various other processing steps, so long as the first gate lower metal layer ultimately exhibits a work function different from that of the second gate's lower metal layer. In this manner, work function of the respective transistor gates can be optimized.

One particularly suitable technique for modifying work function includes plasma treatment. Plasma treatment may be effective to reduce oxygen and/or carbon content. If a nitrogen-containing plasma is used, then plasma treatment might also increase nitrogen content. A nitrogen-containing plasma may be formed from gases including one or more of $N_2$, $NH_3$, and $NF_3$. Instead of or in addition to a nitrogen-containing plasma, a plasma may be formed including arsenic, phosphorus, and/or antimony to modify work function of a lower metal layer, optimizing for use with a n-channel. Similarly, a plasma may be formed including boron, aluminum, gallium, and/or indium to modify work function of a lower metal layer, optimizing for use with a p-channel. Modifying work function may include reducing the work function, such as in treatment with a nitrogen-containing plasma to reduce oxygen and/or carbon content and increase nitrogen content. Depending upon work function of the starting material, modifying work function may instead include increasing work function.

In another aspect of the invention, a transistor gate forming method includes forming a first transistor gate suitable for use with a n-channel and a second transistor gate suitable for use with a p-channel. Each of the two gates includes an upper metal layer containing titanium nitride formed on and in physical contact with a lower metal layer containing tantalum nitride. The lower metal layer of the first gate originates from an as-deposited tantalum nitride material exhibiting a work function the same as exhibited in an as-deposited tantalum nitride material from which the lower metal layer of the second gate originates. However, the lower metal layer of the first gate exhibits a work function and oxygen and carbon content that are reduced from their as-deposited state by plasma treatment to differ from a work function and oxygen and carbon content exhibited by the lower metal layer of the second gate.

Understandably, a variety of techniques may be implemented to form a first and a second transistor gate exhibiting different work functions. According to a further aspect of the invention, a transistor gate forming method includes forming a lower metal layer exhibiting a work function and modifying the work function of a first portion of the lower metal layer without modifying the work function of a second portion of the lower metal layer. An upper metal layer is formed over the first and second portions of the lower metal layer. A first transistor gate is formed including material from the upper metal layer and material from the first portion of the lower metal layer. A second transistor gate is formed including material from the upper metal layer and material from the second portion of the lower metal layer. By way of example, layer compositions and processing methods described elsewhere herein in association with other transistor gate forming methods may be used with the present aspect of the invention.

Although a variety of conventional methods may be used to form the lower metal layer and the upper metal layer, atomic layer deposition (ALD) may be particularly suitable for forming the lower metal layer and supercritical fluid deposition (SFD) may be particularly suitable for forming the upper metal layer. ALD avoids damage to the gate dielectric and provides excellent step coverage. SFD also provides excellent step coverage. If forming tantalum nitride, then pentakis dimethyl amido tantalum (PDMAT) may be a particularly suitable ALD precursor.

Modifying the work function of the first portion without modifying the work function of the second portion may include any of a variety of techniques for selectively altering composition of the first portion at the exclusion of the second portion. For example, modifying the work function may include masking the second portion and plasma treating such that only the work function of the first portion is modified. When using a nitrogen-containing plasma, a silicon oxide layer, photo resist, etc. may be a suitable mask at appropriate thicknesses known to those of ordinary skill, depending upon plasma conditions such as composition, density, temperature, pressure, and processing time.

Figure 1:
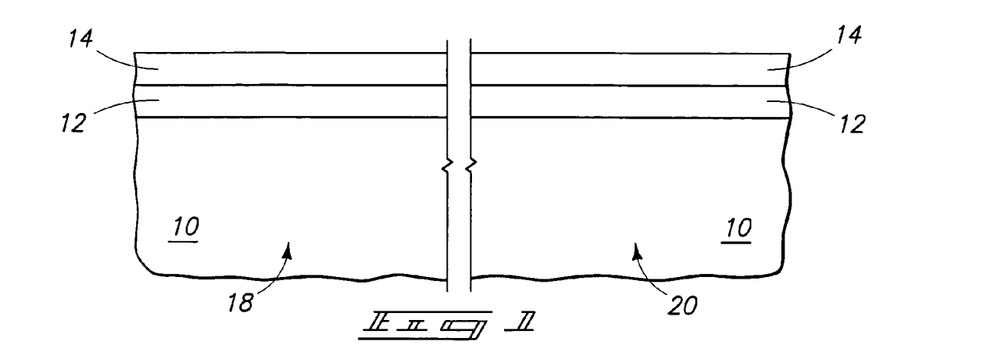
FIGS. 1-5 are partial sectional views at sequential process stages leading to formation of the transistor gates of FIG. 5 formed on a substrate according to one aspect of the invention.
Figure 3:
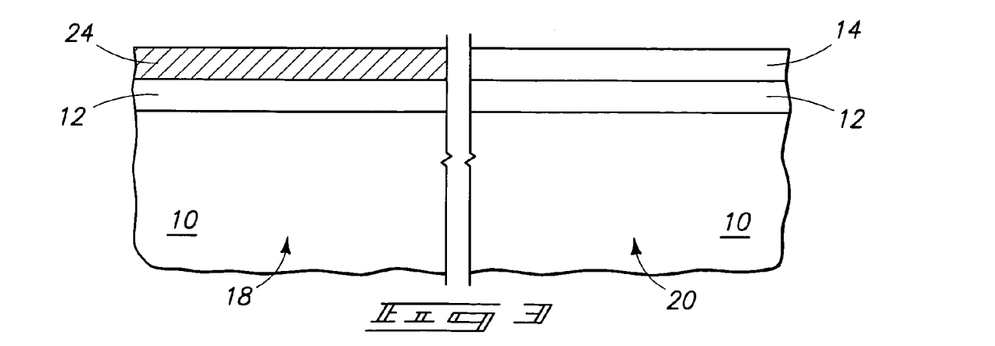
Figure 4:
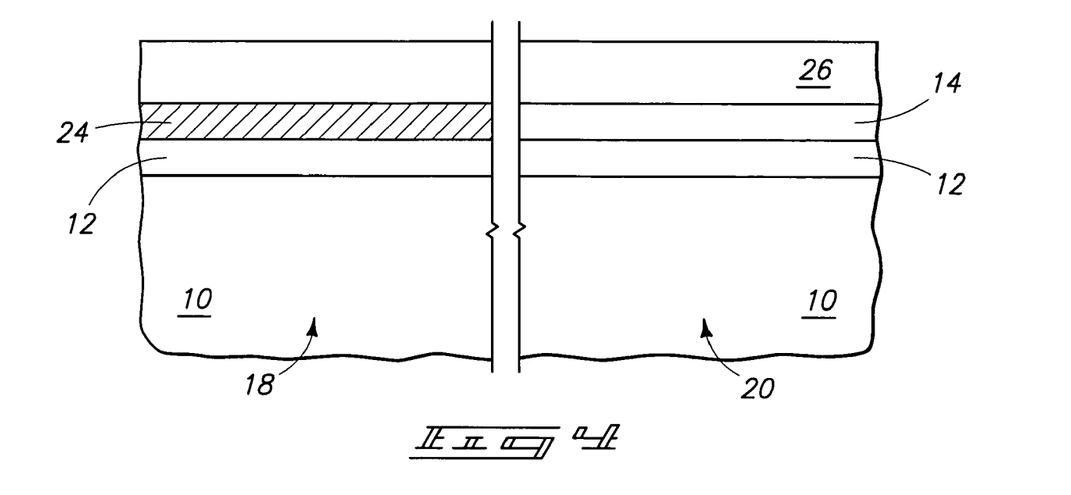
Figure 5:
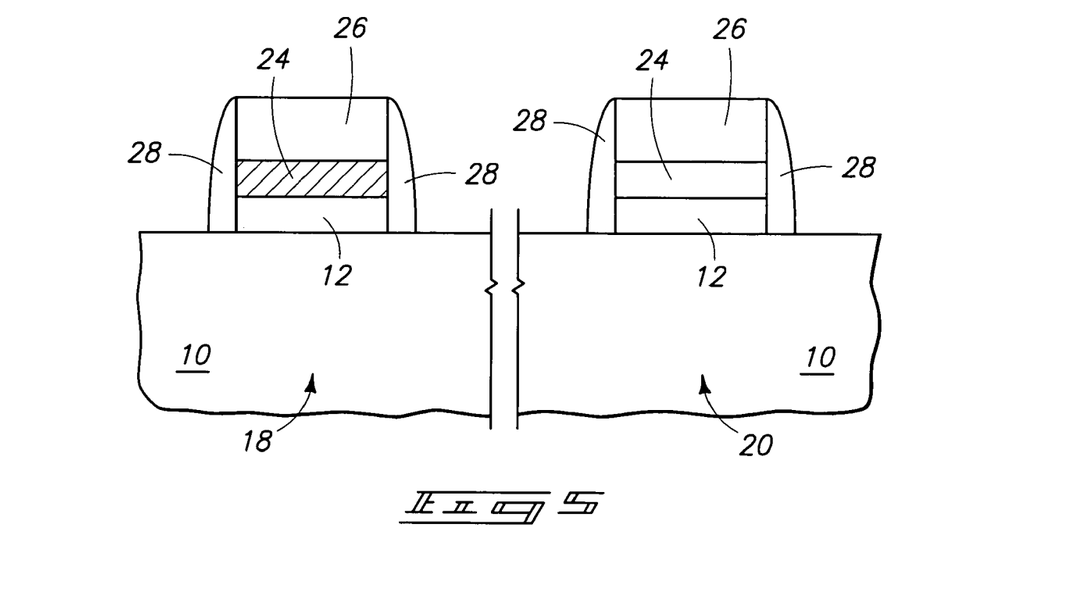

FIGS. 1-5 show sequential process stages leading to formation of transistor gates shown in FIG. 5. In FIG. 1, a gate dielectric layer 12 is formed on substrate 10 and a lower metal layer is formed on gate dielectric layer 12. Substrate 10 may be semiconductive. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 includes a n-region 18 exhibiting n-type conductivity and adapted for use as a n-channel. Substrate 10 also includes a p-region 20 exhibiting p-type conductivity and adapted for use as a p-channel.

Understandably, a large variety of options known to those of ordinary skill exist for forming a n-channel and a p-channel and it is expected that the various aspects of the invention described herein may be adapted for use with most, if not all, of the various channel structure and composition options. Thus, the Figures refer generically to n-region 18 and p-region 20 without limitation to any particular n-channel or p-channel structure or composition. As indicated previously, aspects of the invention may be particularly suitable for conventional CMOS configurations.

Substrate dielectric layer 12 may have a thickness of from about 5 to about 1,000 Angstroms and include conventional materials. Lower metal layer 14 may have a thickness of from about 5 to about 1,000 Angstroms, or preferably from about 10 to about 20 Angstroms, and include compositions described herein. When lower metal layer 14 includes tantalum nitride, it may exhibit a composition of $TaN_x$, where "x" ranges from 0.1 to 1. Accordingly, increasing nitrogen content may refer to increasing the value of "x" closer to 1. ALD of tantalum nitride using PDMAT may produce the described $TaN_x$ composition.

Figure 2:
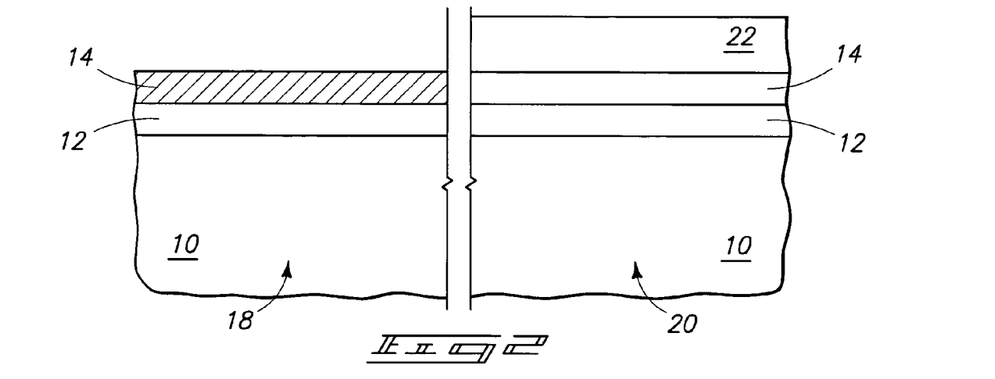

FIG. 2 shows a mask 22 formed over p-region 20 prior to plasma treatment using $N_2$, $NH_3$, $NF_3$, or combinations thereof at a temperature of from about 50° C. to about 800° C. and a pressure of from about $10^{-6}$ (ultra high vacuum) to about 50 Torr for from about 1 second to about 2 hours. Temperature may be from 550 to 600° C. Temperature, pressure, time, and composition for the plasma treatment may vary depending upon the thickness and composition of lower metal layer 14.

If lower metal layer 14 is too thick, then plasma treatment might not effectively modify work function even at the high end of the ranges for temperature, pressure, and time. Although a work function shift might initially occur in at least a part of lower metal layer 14, subsequent heat treatments in the normal process flow of producing a final product may tend to shift work function back toward the as-deposited value. If work function as-deposited is between 4.6 to 5.2 and work function as-modified is between 3.9 to 4.5 with a suitable difference between work functions for CMOS applications, then a shift in work function back to between 4.4 to 4.6 would be highly detrimental to CMOS performance. However, those of ordinary skill using conventional knowledge of plasma properties and thickness and composition of a particular lower metal layer may adapt the teachings herein to a variety of transistor gate materials.

FIG. 3 shows a modified lower metal layer 24 after plasma treatment and removal of mask 22. In FIG. 4, an upper metal layer 26 is formed on and in physical contact with lower metal layer 14 and modified lower metal layer 24 prior to subsequent patterning into desired transistor gate lines such as shown in FIG. 5 with conventional spacers 28 formed thereon. FIG. 5 thus shows a NMOS 3-layer gate stack including gate dielectric layer 12, modified lower metal layer 24, and upper metal layer 26 and a PMOS 3-layer gate stack including gate dielectric layer 12, lower metal layer 14, and upper metal layer 26. Even so, other configurations are conceivable that include the aspects of the invention.

For example, additional layers may be included above, below, and/or between the lower and upper metal layers. Of course, such modifications preferably do not alter the work function difference needed for proper CMOS performance. Accordingly, the respective transistor gates shown in FIG. 5 may be said to "consist essentially" of their respective lower and upper metal layers, thus excluding materials that do not materially affect the basic and novel characteristics of the invention. Upper metal layer 26 is useful in providing a highly conductive component to the transistor gate in the event that an optimizable material suitable for use in lower metal layer 14 nevertheless exhibits a lower conductivity than desired. The most suitable materials for upper metal layer 26 include tungsten, titanium nitride, titanium silicide, tantalum silicide, and tungsten silicide. Upper metal layer 26 may have a thickness of from about 50 to about 2,000 Angstroms, or preferably from 100 to 300 Angstroms, which is thicker than lower metal layer 14 since concern for the effectiveness of work function modification might not apply.

According to a still further aspect of the invention, a transistor gate forming method includes forming a lower metal layer containing tantalum nitride and exhibiting a work function. The work function of a first portion of the lower metal layer is reduced without modifying the work function of a second portion of the lower metal layer by masking the second portion, plasma treating the first portion, and reducing oxygen and carbon content of the first portion. An upper metal layer is formed containing titanium nitride on and in physical contact with the first and second portions of the lower metal layer. A first transistor gate is formed including material from the upper metal layer and material from the first portion of the lower metal layer and a second transistor gate is formed including material from the upper metal layer and material from the second portion of the lower metal layer.

Given the variations in methods for forming a transistor gate, it follows that a variety of structures may result. According to a still further aspect of the invention, an integrated circuit includes a transistor gate in operative association with a n-channel and a transistor gate in operative association with a p-channel. Each of the two gates includes a lower metal layer and an upper metal layer. The lower metal layer of the n-channel gate consists essentially of the same elements as the lower metal layer of the p-channel gate, but in different proportions such that the two gates exhibit different work functions that correspond to the conductivity type of their respective channels. By way of example, the properties, compositions, and structures for the lower and upper metal layers described herein with respect to other aspects of the invention also may apply to the present aspect. In addition, the lower metal layer of the n-channel gate may consist of the same elements as the lower metal layer of the p-channel gate. The lower metal layer of the n-channel gate may contain less oxygen and/or carbon in comparison to the lower metal layer of the p-channel gate. The lower metal layer of the n-channel gate may contain more nitrogen in comparison to the lower metal layer of the p-channel gate.

In a still further aspect of the invention, an integrated circuit includes a transistor gate in operative association with a n-channel and a transistor gate in operative association with a p-channel. Each of the two gates includes an upper metal layer containing titanium nitride on and in physical contact with a lower metal layer containing tantalum nitride. The lower metal layer of the n-channel gate contains less oxygen and carbon in comparison to the lower metal layer of the p-channel gate. The two gates exhibit different work functions that correspond to the conductivity type of their respective channels.

Figure 9:
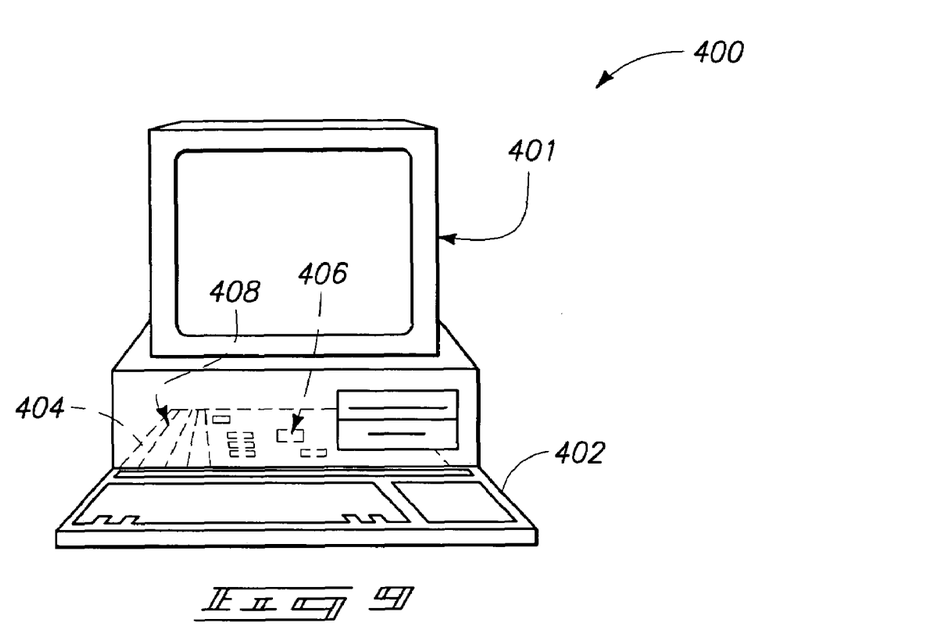
FIG. 9 is a diagrammatic view of a computer illustrating an exemplary application of the present invention.

FIG. 9 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 10. In such block diagram, the addressing circuitry is illustrated as 410 and the read circuitry is illustrated as 412.

Figure 10:
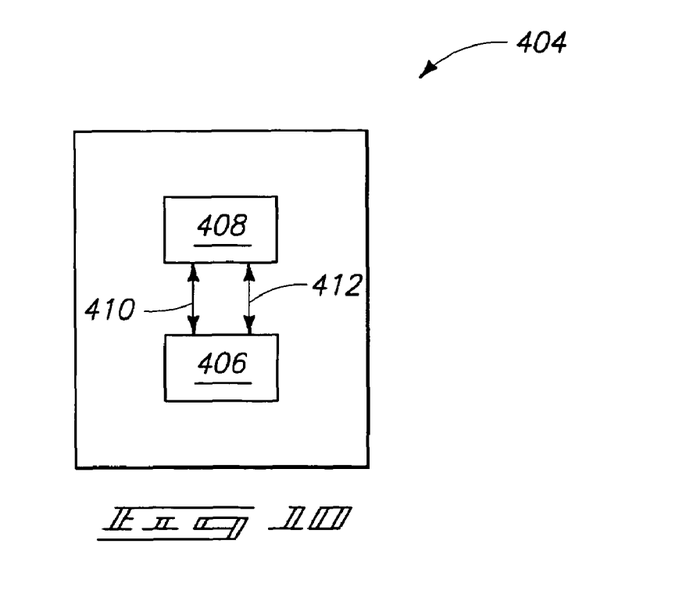
FIG. 10 is a block diagram showing particular features of the motherboard of the FIG. 9 computer.

In particular aspects of the invention, memory device 408 can correspond to a memory module. For example, single in-line memory modules (SIMMs) and dual in-line memory modules (DIMMs) may be used in the implementation that utilizes the teachings of the present invention. The memory device can be incorporated into any of a variety of designs that provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory that allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 11:
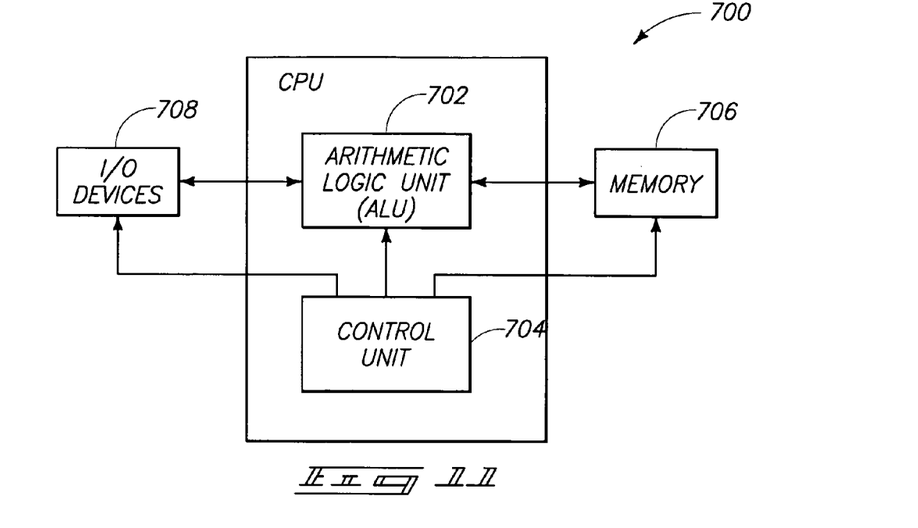
FIG. 11 is a high level lock diagram of an electronic system according to an exemplary aspect of the present invention.

FIG. 11 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

Figure 12:
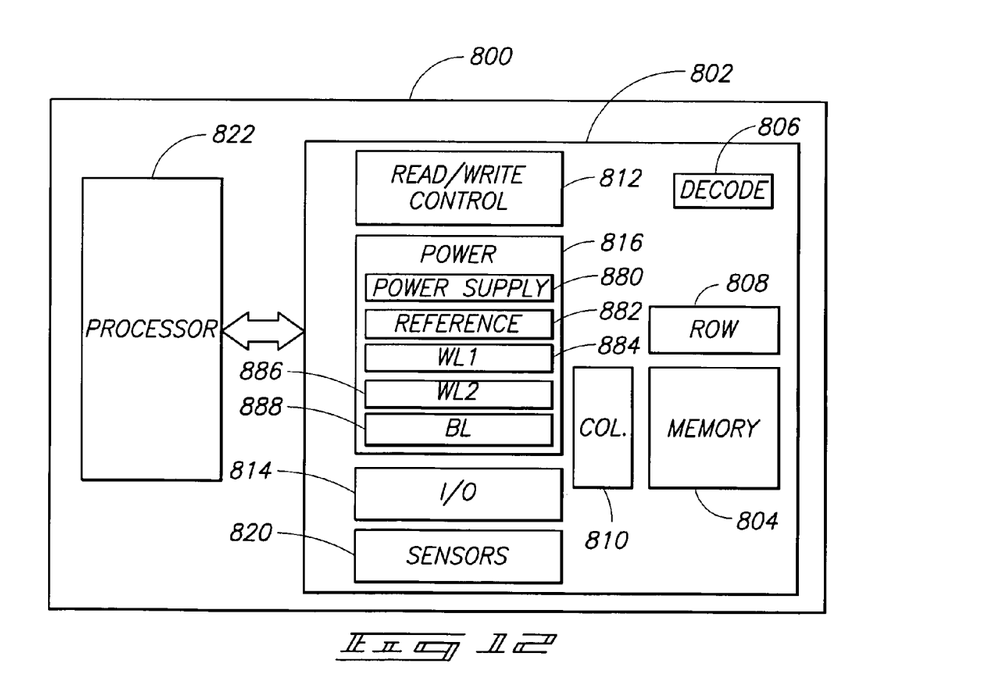
FIG. 12 is a simplified block diagram of an exemplary memory device according to an aspect of the present invention.

FIG. 12 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first word line with pulses, circuitry 886 for providing the second word line with pulses, and circuitry 888 for providing the bit line with pulses. The system 800 also includes a processor 822, or memory controller for memory accessing.

The memory device 802 receives control signals 824 from the processor 822 over wiring or metallization lines. The memory device 802 is used to store data that is accessed via I/O lines. It will be appreciated by those skilled in the art that additional circuitry and control-signals can be provided, and that the memory device 802 has been simplified to help focus on the invention. At least one of the processor 822 or memory device 802 can include a capacitor construction in a memory device of the type described previously herein.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

EXAMPLE

Figure 8:
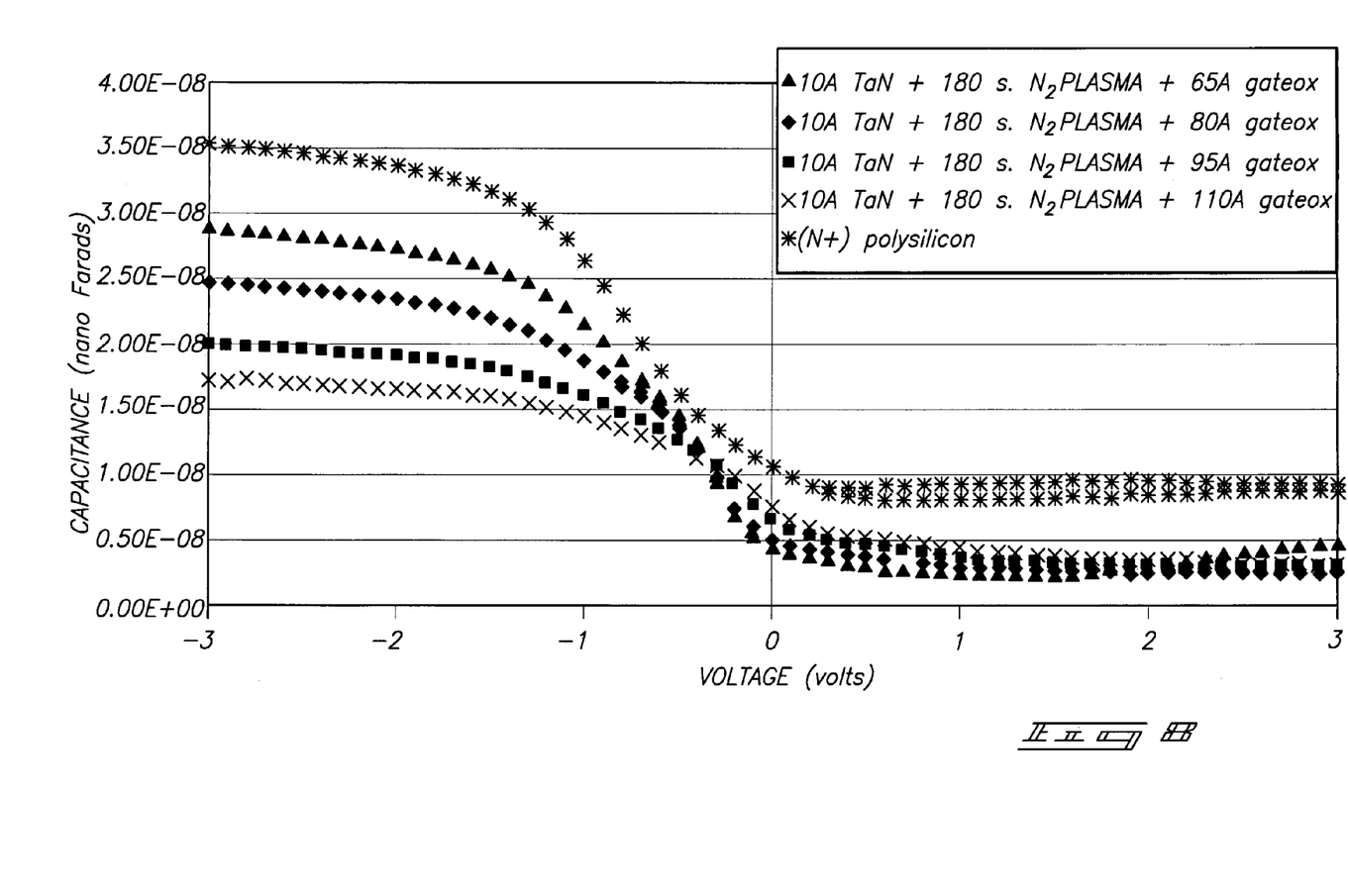
FIG. 8 shows a chart comparing work function for various transistor gate structures with different gate dielectric thicknesses.

Transistor gate electrodes were formed using various thicknesses and materials and evaluated for work function properties as shown in FIGS. 6-8. TaN was deposited by ALD using PDMAT and treated by exposure to a plasma generated using 400 Watts of power at 600° C. and 8 Torr with 1,500 standard centimeter$^3$/min. (sccm) $N_2$, 4,000 sccm $H_2$, 5,000 sccm Ar, and 4,000 sccm He. TiN was deposited by SFD at 650° C. using $TiCl_4$ and $NH_3$. For comparison, conventional n+ doped polysilicon gate electrodes having thicknesses of 500 to 2,500 Angstroms were also evaluated.

FIG. 6 shows data from evaluation of electrodes prior to exposure to annealing and BPSG reflow conditions. Properties of the electrodes without plasma treatment are very similar, but properties of electrodes formed with plasma treatment are noticeably shifted.

FIG. 7 shows data from evaluation of electrodes after exposure to 975° C. annealing using $N_2$ for 10 sec. and 760° C. BPSG reflow heating using $N_2$ for 30 min. The electrodes with plasma treatment did not shift back toward their as-deposited state and, instead, shifted slightly further away. Increasing length of plasma treatment appears to increase the degree of shifting, perhaps indicating that even the 180 sec. plasma treatment leaves some oxygen and carbon content behind and/or further treatment may further increase nitrogen content. Evaluation indicated that further shifting stopped at about 240 sec. of plasma treatment.

FIG. 8 compares the effect of gate oxide thickness among electrodes with otherwise similar structure and processing and also compares the properties of n+ doped polysilicon.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A transistor gate forming method comprising forming a first and a second transistor gate, each of the two gates including a lower metal layer and an upper metal layer, the lower metal layer of the first gate originating from an as-deposited material exhibiting a work function the same as exhibited in an as-deposited material from which the lower metal layer of the second gate originates, but the lower metal layer of the first gate exhibiting a work function that is modified from its as-deposited state to differ from a work function exhibited by the lower metal layer of the second gate.

2. The method of claim 1 wherein the lower metal layers comprise a first metal and the upper metal layers comprise a second metal different from the first metal.

3. The method of claim 1 wherein the lower metal layers comprise the same one or more material selected from the group consisting of titanium, tantalum, tungsten, titanium nitride, tantalum nitride, tungsten nitride, aluminum nitride, titanium silicide, tantalum silicide, tungsten silicide, and tantalum silicon nitride.

4. The method of claim 1 wherein the lower metal layers comprise tantalum nitride and the upper metal layers comprise titanium nitride.

5. The method of claim 1 wherein the material from which the lower metal layer of the first gate originates is deposited simultaneously with the material from which the lower metal layer of the second gate originates.

6. The method of claim 1 wherein the upper metal layers originate from a simultaneously deposited material that is different from the material from which the lower metal layers originate.

7. The method of claim 1 wherein the first gate exhibits properties suitable for use with a n-channel.

8. The method of claim 1 wherein the second gate exhibits properties suitable for use with a p-channel.

9. The method of claim 1 wherein modifying the work function comprises altering composition of the as-deposited material from which the lower metal layer of the first gate originates.

10. The method of claim 9 wherein altering composition comprises reducing oxygen and/or carbon content.

11. The method of claim 9 wherein altering composition comprises increasing nitrogen content.

12. The method of claim 1 wherein modifying the work function comprises plasma treatment.

13. The method of claim 1 wherein modifying the work function comprises reducing the work function.

14. The method of claim 1 wherein the upper metal layers are formed on and in physical contact with the lower metal layers.

15. The method of claim 1 comprising forming the transistor gates in a memory device.

16. A transistor gate forming method comprising forming a first transistor gate suitable for use with a n-channel and a second transistor gate suitable for use with a p-channel, each of the two gates including an upper metal layer containing titanium nitride formed on and in physical contact with a lower metal layer containing tantalum nitride, the lower metal layer of the first gate originating from an as-deposited tantalum nitride material exhibiting a work function the same as exhibited in an as-deposited tantalum nitride material from which the lower metal layer of the second gate originates, but the lower metal layer of the first gate exhibiting a work function and oxygen and carbon content that are reduced from their as-deposited state by plasma treatment to differ from a work function and oxygen and carbon content exhibited by the lower metal layer of the second gate.

17. A transistor gate forming method comprising:
forming a lower metal layer exhibiting a work function;
modifying the work function of a first portion of the lower metal layer without modifying the work function of a second portion of the lower metal layer;
forming an upper metal layer over the first and second portions of the lower metal layer;

forming a first transistor gate including material from the upper metal layer and material from the first portion of the lower metal layer; and forming a second transistor gate including material from the upper metal layer and material from the second portion of the lower metal layer.

18. A transistor gate forming method comprising:

forming a lower metal layer containing tantalum nitride and exhibiting a work function;

reducing the work function of a first portion of the lower metal layer without modifying the work function of a second portion of the lower metal layer by masking the second portion, plasma treating the first portion, and reducing oxygen and carbon content of the first portion;

forming an upper metal layer containing titanium nitride on and in physical contact with the first and second portions of the lower metal layer;

forming a first transistor gate including material from the upper metal layer and material from the first portion of the lower metal layer; and forming a second transistor gate including material from the upper metal layer and material from the second portion of the lower metal layer.

19. The method of claim 16 wherein the material from which the lower metal layer of the first gate originates is deposited simultaneously with the material from which the lower metal layer of the second gate originates.

20. The method of claim 16 further comprising increasing nitrogen content of the lower metal layer of the first gate.

21. The method of claim 17 wherein the lower metal layer comprises a first metal and the upper metal layer comprises a second metal different from the first metal.

22. The method of claim 17 wherein the lower metal layer and the upper metal layer comprise one or more material independently selected from the group consisting of titanium, tantalum, tungsten, titanium nitride, tantalum nitride, tungsten nitride, aluminum nitride, titanium silicide, tantalum silicide, tungsten silicide, and tantalum silicon nitride.

23. The method of claim 17 wherein the lower metal layer comprises tantalum nitride and the upper metal layer comprises titanium nitride.

24. The method of claim 17 wherein forming the lower metal layer comprises ALD and forming the upper metal layer comprises SFD.

25. The method of claim 17 wherein modifying the work function comprises altering composition of the first portion.

26. The method of claim 25 wherein altering composition comprises reducing oxygen and/or carbon content.

27. The method of claim 25 wherein altering composition comprises increasing nitrogen content.

28. The method of claim 17 wherein modifying the work function comprises masking the second portion and plasma treating the first portion.

29. The method of claim 17 wherein modifying the work function comprises reducing the work function.

30. The method of claim 17 wherein the upper metal layer is formed on and in physical contact with the lower metal layer.

31. The method of claim 17 comprising forming the transistor gates in a memory device.

32. The method of claim 18 wherein forming the lower metal layer comprises ALD and forming the upper metal layer comprises SFD.

33. The method of claim 18 further comprising increasing nitrogen content of the first portion.

* * * * *